(12) United States Patent
Wendel et al.

(10) Patent No.: US 6,922,060 B1
(45) Date of Patent: Jul. 26, 2005

(54) METHOD FOR DETECTING PARTIAL CONDUCTOR SHORT CIRCUITS, AND DEVICE FOR PERFORMING AND USING THE METHOD

(75) Inventors: Christoph Wendel, Laufenburg (DE); Mike Offermann, Cottbus (DE)

(73) Assignee: ALSTOM Technology Ltd., Baden (CH)

( * ) Notice: Subject to any disclaimer, the term of this patent is extended or adjusted under 35 U.S.C. 154(b) by 0 days.

(21) Appl. No.: 10/625,468

(22) Filed: Jul. 23, 2003

(30) Foreign Application Priority Data

Jul. 23, 2002 (CH) ............................................. 1297/02

(51) Int. Cl.⁷ ............................................. G01R 31/02
(52) U.S. Cl. ........................................ 324/545; 324/541
(58) Field of Search ........................ 310/179; 324/533, 324/534, 537, 539, 545, 546, 637, 541

(56) References Cited

U.S. PATENT DOCUMENTS

| | | | | |
|---|---|---|---|---|
| 3,896,376 A | * | 7/1975 | Sinniger | 324/772 |
| 4,996,486 A | * | 2/1991 | Posedel | 324/545 |
| 5,126,680 A | * | 6/1992 | Morin et al. | 324/724 |
| 5,661,410 A | * | 8/1997 | Haldemann | 324/772 |
| 5,777,417 A | | 7/1998 | Haldemann | 310/201 |
| 5,914,608 A | * | 6/1999 | Wissman et al. | 324/522 |
| 5,977,773 A | * | 11/1999 | Medelius et al. | 324/520 |
| 6,323,654 B1 | * | 11/2001 | Needle et al. | 324/534 |
| 6,489,781 B1 | * | 12/2002 | Kliman et al. | 324/545 |
| 6,703,752 B2 | | 3/2004 | Haldemann | 310/213 |
| 6,791,351 B2 | * | 9/2004 | Fischer et al. | 324/772 |

FOREIGN PATENT DOCUMENTS

| | | |
|---|---|---|
| DE | 968 188 | 2/1958 |
| EP | 0 778 648 A1 | 6/1997 |
| EP | 0 810 445 A1 | 12/1997 |
| FR | 2 766 274 | 1/1999 |

OTHER PUBLICATIONS

"Manufacturing and Testing of Roebel Bars", Brown Boveri Rev v57, Jan. 1, 1970, P 25–31, by Marti et al.*
Search Report from Swiss Application 2002 1297/02 (Oct. 16, 2002).

* cited by examiner

Primary Examiner—Anjan Deb
Assistant Examiner—Walter Benson
(74) Attorney, Agent, or Firm—Cermak & Kenealy, LLP; Adam J. Cermak

(57) ABSTRACT

In a method for detecting partial conductor short circuits (7) in a conductor (11) including plural mutually insulated partial conductors (5) in which the partial conductors (5) are connected together at one or both ends of the conductor (11) by a short circuit (3), a simple measurement without changes to the conductor is made possible in that the propagation behavior of time-varying electrical signals is measured on the conductor (11), that the measured propagation behavior is compared with the propagation behavior on a reference conductor without partial conductor short circuits, and that conclusions are drawn as to the presence of partial conductor short circuits from the changes in propagation behavior given by the comparison.

17 Claims, 3 Drawing Sheets

METHOD FOR DETECTING PARTIAL CONDUCTOR SHORT CIRCUITS, AND DEVICE FOR PERFORMING AND USING THE METHOD

FIELD OF THE INVENTION

The present invention relates to the field of conduction measurement techniques. It relates to a method for detecting partial conductor short circuits in a conductor including plural mutually insulated partial conductors. It furthermore relates to a device for performing the method and also an application of the method.

DESCRIPTION OF PRIOR ART

It is frequently desired to detect possible short circuits arising between the partial conductors in mutually insulated conductor pairs running parallel, without the conductor pair having to be tested sectionally over the whole length or demounted. An example of such a conductor configuration is the conductor, known as a Roebel bar, from the stator of an electrical machine, in which mutually insulated partial conductors are twisted together within a rod having a rectangular cross section such that given currents or fields are compensated (see, e.g., EP-A1-0 778 648).

In a conventional procedure for detecting short circuits between the partial conductors of a conductor pair, the partial conductors are separated from one another at the ends and an electrical direct or alternating current is applied. Conclusions can then be drawn from the resulting current flow regarding any short circuits.

Likewise a given direct or alternating current can be fed into these mutually insulated partial conductors and the voltage between the conductors can be measured. From the behavior of the voltage and the current flow, conclusions can likewise be drawn about short circuits.

In both methods, it is indifferent whether direct or alternating voltages, or direct or alternating currents, are applied to the conductor pairs. The determination of freedom from short circuits, or of the short circuits, is not linked to any form of voltage or current.

As a third method, there exists the possibility of feeding in a pulse voltage with high edge steepness. The presence and the position of a short circuit can then be detected from the pulse echo according to a pulse time delay method with known signal time delay in the conductor pair. The position resolution which can be attained with this method is given by the present technical possibilities of measurement of fast signal flanks and at present is about 10 cm.

This third method can be used with conductor pairs which are mutually insulated on both sides, but also with conductor pairs which have a one-sided short circuit. The conductor pair must however be mutually insulated at the feed-in place, in order to be able to feed in the fast pulse conductively. The detection of plural short circuits is in principle not possible, so that only the first short circuit beyond the pulse input can be found.

This third method can likewise be used in a modified form when the conductor pairs are short circuited on both sides. In this case, the insulation between the conductor pairs has to be damaged in order to be able to feed the pulse in conductively. In principle, the reliability of detection is the greater, the further the feed-in is from the short-circuited ends. As a consequence of this limitation, the detection of the position of the short circuit is the more unreliable, the shorter the conductor pair. In general, in the case of short circuits on both sides, the position determination of the short circuits is not possible with conductor lengths of a few meters.

Summarizing the disadvantages of the abovementioned methods, there are to be mentioned:

1. The partial conductors must be insulated from each other at the conductor ends on both sides, in order to be able to reliably detect short circuits (methods 1, 2 and 3); or,
2. The partial conductors have to be insulated from each other at least on one side, in order to detect short circuits (method 3); or,
3. The insulation between the partial conductors must be damaged in order to be able to feed in the signal conductively. Primarily this must take place in the middle between the conductor ends (method 3).
4. If the whole arrangement consists of more than one conductor pair, all possible permutations have to be measured for monitoring the freedom from short circuits. The number of permutations is calculated as $N=(n^2-n)/2$, where N equals the number of permutations and n equals the number of the parallel partial conductors. A conductor bundle consists of 64 individual conductors. Then 2,016 measurements have to be performed. With a correspondingly larger number of individual conductors, the number of measurements required increases considerably. In particular, method 3, in principle reacting only slowly, would thus require such a long measurement time that this method is technically unusable.

SUMMARY OF THE INVENTION

The invention thus has as its object to provide a method of determining the freedom from short circuits of conductor pairs short-circuited at one or both sides, with only one or at most two measurements, and indeed independently of the number of parallel and mutually insulated partial conductors, and also to give a device for performing the method and a use of the invention.

A principle of the invention consists in measuring on the conductor to be investigated the propagation behavior of time-varying electrical signals, and in comparing it with the propagation behavior of a reference conductor without partial conductor short circuits, and to draw conclusions as to the presence of partial conductor short circuits from the changes in propagation behavior given by the comparison. It is hereby possible in a simple manner and without manipulations altering the conductor to be measured, to detect short circuits between optional partial conductors.

A first preferred embodiment of the method according to the invention is distinguished in that the complex reflection behavior is measured as the propagation behavior; in that periodic, particularly sinusoidal, signals of a predetermined frequency are used as the time-varying signals, and in that the frequency is varied in a predetermined frequency range for measuring the reflection behavior, and the signals returning from the conductor are received and are evaluated as regards their electrical parameters, particularly their amplitude, the frequency being varied in the range of a few kHz to a few 100 MHz, in particular in the range of about 100 kHz to about 200 MHz.

It has been found to be particularly favorable that the time-varying electrical signals are fed into an end of the conductor provided with a short circuit, that an auxiliary conductor is arranged parallel to the conductor at a distance, and that the signals returning via the auxiliary conductor are received and evaluated.

A preferred embodiment of the device according to the invention is characterized in that the signal source and the measuring device are part of a network analyzer, and that a signal separating filter is inserted between the lead to the conductor and the lead back from the auxiliary conductor for matching the signal amplitudes of the fed-in and received signals.

Further modifications will become apparent from the dependent claims.

BRIEF DESCRIPTION OF THE FIGURES

The invention is described in detail hereinafter using embodiment examples in connection with the accompanying drawing.

DESCRIPTION OF PREFERRED EMBODIMENTS

Figure 1:
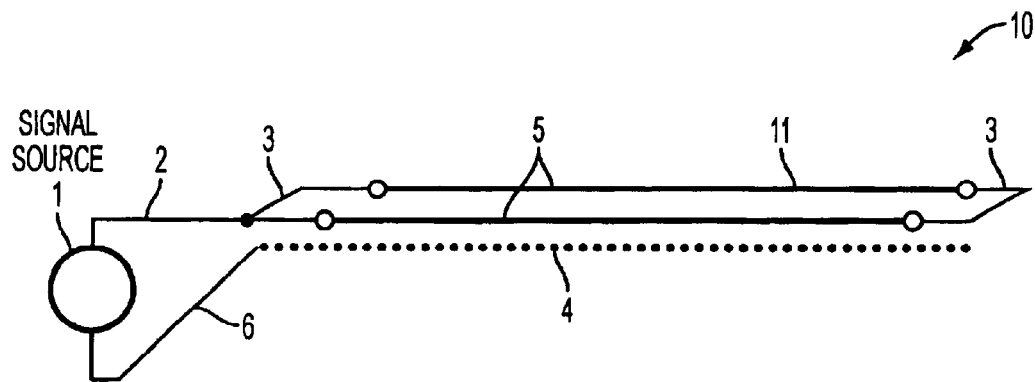
FIG. 1 shows a simplified diagram of principle of a device for measuring the reflection behavior of a conductor with two short circuited ends including two partial conductors without partial conductor short circuit, according to a preferred embodiment example of the invention.

A simplified diagram of principle of a device 10 for measuring the reflection behavior of a conductor 11 with short circuited ends on both sides including two partial conductors 5 without partial conductor short circuit according to a preferred embodiment example of the invention is shown in FIG. 1. According to FIG. 1, a signal source 1 is connected by means of an electrically conducting connection (input lead 2) to the short circuited partial conductor 5 so that the signal source 1 feeds a periodic or else non-periodic signal to a short circuited side (short circuit 3) of the partial conductor 5, and that the return of the signal takes place by means of an electrically conducting auxiliary conductor 4 and an electrically conducting return lead 6. The signal source 1 is equipped with a measuring device for determining the electrical parameters of the signal which feeds the partial conductor 5 by means of the input lead 2 and the electrical parameters of the signal which returns to the signal source via the auxiliary conductor 4 and the electrically conducting return lead 6.

Figure 6:
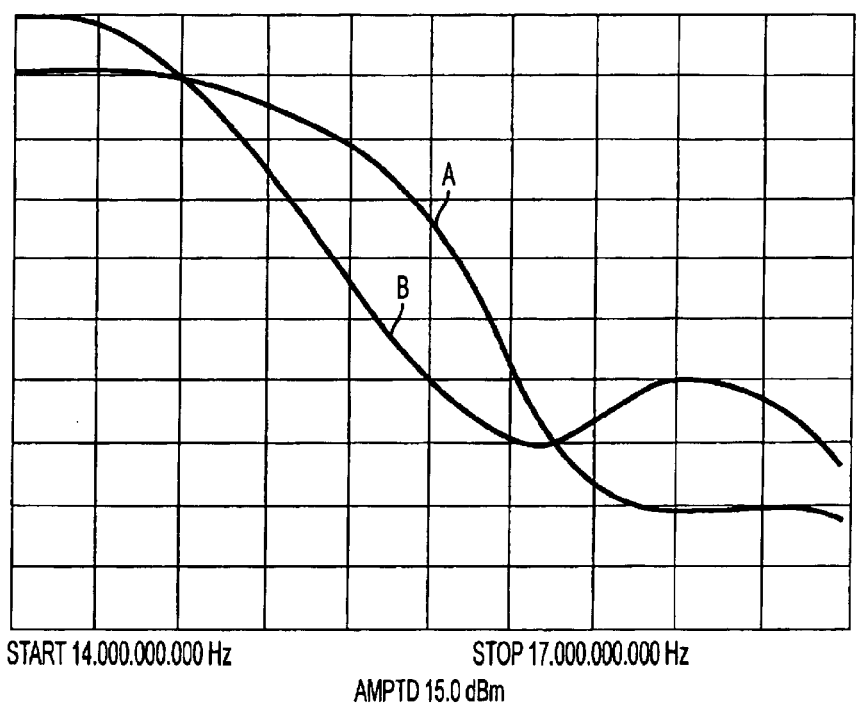

Signal source 1 and measuring device are preferably part of a network analyzer, such as is known under the type designation SNA-1 (frequency range 100 kHz –180 MHz) of the Wandel and Goltermann company, or under the type designation 3577A (frequency range 5 Hz –200 MHz) of the Hewlett Packard company. The auxiliary conductor 4 running parallel to the conductor 11 is preferably an insulated copper conductor. The reflection factor can be measured over a frequency range of 100 kHz –200 MHz in dependence on the frequency of a fed-in sinusoidal signal with the device 10 according to FIG. 1. An excerpt of such a curve for a Roebel bar without partial conductor short circuit is shown in FIG. 6 as curve B.

Figure 2:
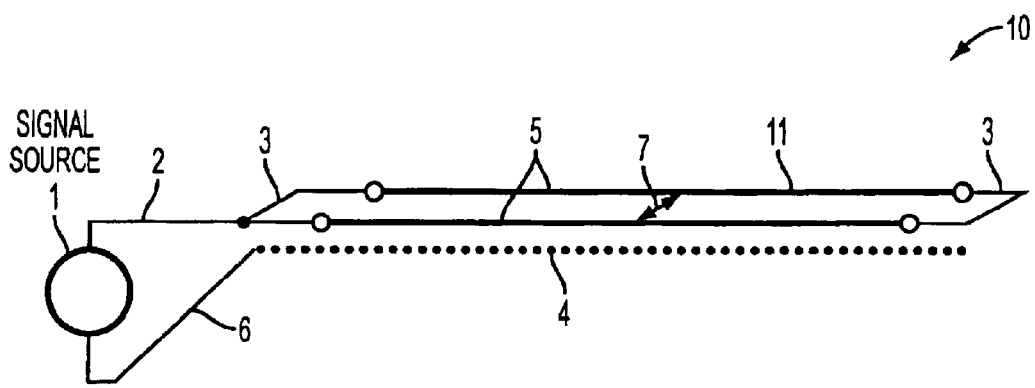
FIG. 2 shows the device of FIG. 1 with a partial conductor short circuit.
Figure 3:
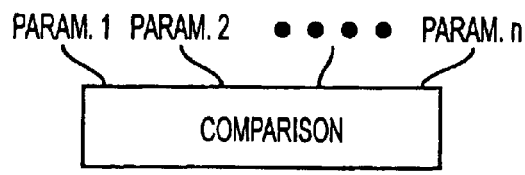
FIG. 3 shows a simplified diagram of the measurement principle according to the invention.

According to FIG. 2, a measurement comparable to FIG. 1 is performed on a conductor 11 with a partial conductor short circuit 7 (or several partial conductor short circuits). For determining the freedom from short circuits, the detected parameters 1, . . . , n of a pairing of partial conductors 5 without short circuit (FIG. 1) are compared with the parameters which were determined during following measurements (FIG. 3). If now one of the following conductor pairings has further partial conductor short circuits 7 besides the (predetermined) short circuits 3 at the conductor ends, the parameters from the measurement with partial conductor short circuit 7 (FIG. 2) deviate from the parameters from the measurement without partial conductor short circuit (FIG. 1). These parameters can be compared both visually and electronically in order to obtain the result of this comparison (according to FIG. 3).

Figure 4:
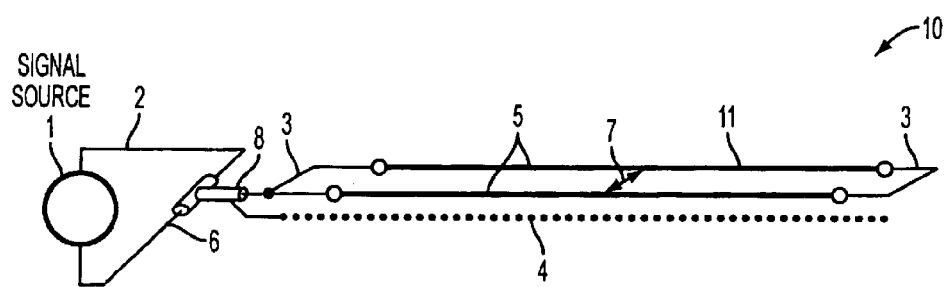
FIG. 4 shows, in a diagram comparable to FIG. 1, a device according to a further embodiment example of the invention with additional signal separating filter.

A further constructional step of this measurement arrangement is to be seen in FIG. 4, in which a (schematically indicated) signal separating filter 8 is connected between the input lead 2 to the partial conductors 5 and the return lead 6, and matches the signal amplitudes, thus permitting a better differentiation of the recovered electrical parameter sets, which are then compared according to FIG. 3.

Figure 5:
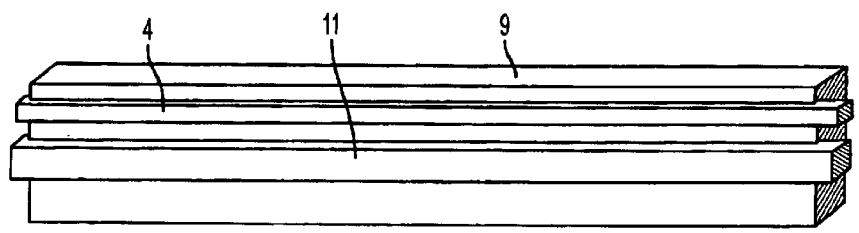
FIG. 5 shows, in a greatly schematized diagram, a retaining device for the conductor to be measured and the auxiliary conductor for the comparative measurements according to the invention; and, FIG. 6 shows measured curves of the reflection factor in dependence on the measurement frequency for an exemplary Roebel bar (without glow protection) with four partial conductor short circuits arranged distributed over the length (curve A) and without partial conductor short circuits (curve B).

According to FIG. 5, a conductor 11 consisting of plural partial conductors which are short circuited at one or both conductor ends is placed in a retaining device 9 (shown simplified) so that both the bundle of partial conductors and also the auxiliary conductor 4 required for the reflection measurement are fixed in this retaining device 9, so that on changing a bundle of partial conductors 5 (on changing from FIG. 1 to FIG. 2), the position between this bundle and the auxiliary conductor 4 is not changed. The electrical input lead 2 and electrical return lead 6 are likewise not drawn in on FIG. 5, as also the signal source 1 and the signal separating filter 8, which are all ideally mechanically firmly fixed with the retaining device 9.

Finally, FIG. 6 shows, in a narrow excerpt of the frequency band (14–17 MHz), a comparison of an electrical parameter (reflection factor) of a conductor pair, short circuited at both ends, in a Roebel bar without glow protection with partial conductor short circuit according to FIG. 2 (curve A) and without partial conductor short circuit according to FIG. 1 (curve B). The difference in the course of the curves can clearly be seen from the comparative representation, and is correspondingly evaluated and can be put to use for detection of the partial conductor short circuits in the Roebel bar or else other conductor pair configurations.

The invention can be summarized as follows, especially in relation to the measurement of Roebel bars.

For the detection of partial conductor short circuits in Roebel bars soldered on both sides, the complex reflection behavior of the bars to be tested can be measured using a network analyzer. For this purpose, the network analyzer feeds the bar with a sinusoidal voltage and varies the frequency in a wide range, e.g., from 100 kHz to 200 MHz. The course of the amplitude is received and stored or else printed.

If a Roebel bar has a partial conductor short circuit, the course of the amplitude deviates from the course of the bars which have no partial conductor short circuit.

Since the bar possesses no return lead, an auxiliary conductor has to be mounted near the bar, and in the simplest case is grounded. In this case the network analyzer is also grounded.

In order to increase the measurement accuracy, a reflection measurement bridge (e.g., of type RFZ-1) can be connected between the bar and the measuring device, and has the main object of eliminating as far as possible initial reflections at the network analyzer and at the connecting places between the network analyzer and the test piece. The method is thereby reduced to a bridge method. Bridge methods are in general very much more sensitive than methods which record only the absolute value of a quantity.

The method described for conductors 11 with short circuit 3 on one side or both sides can also be applied to conductors 11 whose partial conductors 5 are electrically separated from one another at both ends. For this purpose, the partial conductors are first short circuited at at least one of the two ends. Furthermore the conductor 11 thus short circuited for the measurement can be investigated for partial conductor short circuits in the manner according to the invention described hereinabove.

LIST OF REFERENCE NUMERALS

| | |
|---|---|
| 1 | signal source |
| 2 | input lead (electrical) |
| 3 | short circuit |
| 4 | auxiliary conductor (parallel) |
| 5 | partial conductor |
| 6 | return lead (electrical) |
| 7 | partial conductor short circuit |
| 8 | signal separating filter |
| 9 | retaining device |
| 10 | measuring device |
| 11 | conductor |

What is claimed is:

1. A method for detecting partial conductor short circuits between a first end and a second end of a first conductor, the first conductor including plural mutually insulated partial conductors which extend substantially in parallel between said first and second ends and which are short-circuited at said first end, said second end, or both, the method comprising:

arranging an auxiliary conductor in parallel with said first conductor at a distance, thereby creating a first combined conductor;

feeding a time-varying electrical signal into an end of said first combined conductor;

measuring the propagation behavior of said time-varying electrical signal on said first combined conductor;

comparing the measured propagation behavior with a known propagation behavior of a second combined conductor comprising a second conductor as a reference conductor, said second conductor being similar to said first conductor but without partial conductor short circuits; and determining the presence of partial conductor short circuits within said first conductor from the changes in propagation behavior from said comparing.

2. A method according to claim 1, wherein measuring the propagation behavior comprises measuring a complex reflection behavior.

3. A method according to claim 2, wherein measuring comprises measuring the propagation behavior of periodic signals of a predetermined frequency, and wherein the frequency is varied in a predetermined frequency range for measuring the reflection behavior; and comparing comprises receiving and comparing electrical parameters of the signals returning from the first conductor.

4. A method according to claim 3, wherein the frequency is varied in the range of a few kHz to a few 100 MHz.

5. A method according to claim 4, wherein the frequency is varied in the range of about 100 kHz to about 200 MHz.

6. A method according to claim 2, wherein the time-varying signals comprise periodic or non-periodic signals of a predetermined signal form, and further comprising receiving and evaluating signals coming back from the first conductor regarding electrical parameters of said signals.

7. A method according to claim 6, wherein said predetermined signal form comprises rectangular or triangular signal forms.

8. A method in accordance with claim 6, wherein said electrical parameters comprise signal form.

9. A method according to claim 3, wherein comparing comprises comparing electrical amplitude of the signals returning from the conductor.

10. A method according to claim 3, wherein said periodic signals comprise sinusoidal signals.

11. The method according to claim 1, wherein said conductor comprises a Roebel bar from the stator of an electrical machine.

12. The method according to claim 1, wherein the conductor comprises partial conductors which are electrically separated from one another at both ends of said conductor, and further comprising forming a short circuit at at least one of the two ends of said conductor before said measuring.

13. A device useful for detecting partial conductor short circuits, comprising:

a retaining device;

a conductor comprising ends and a plurality of mutually insulated partial conductors being short-circuited at least at one end of said conductor and extending substantially in parallel, and an auxiliary conductor, arranged in parallel and at a fixed distance to each other in the retaining device;

a signal source;

a measuring device;

an input lead; and a return lead;

wherein the conductor is connected at one end via the input lead to the signal source; and wherein the auxiliary conductor is connected via the return lead to the measuring device.

14. A device according to claim 13, further comprising a network analyzer, and wherein the signal source and the measuring device are part of the network analyzer.

15. A device according to claim 13, further comprising:

a signal separating filter for matching the signal amplitudes of the fed-in and received signals between the input lead to the conductor and the return lead from the auxiliary conductor.

16. A device according to claim 13, wherein the auxiliary conductor comprises an insulated copper conductor.

17. A device according to claim 13, wherein the conductor comprises a conductor to be measured or a reference conductor.

* * * * *